(12) United States Patent
Watanabe et al.

(10) Patent No.: US 7,108,521 B2
(45) Date of Patent: Sep. 19, 2006

(54) PRESSFIT TERMINAL AND CONNECTION STRUCTURE

(75) Inventors: Hiromichi Watanabe, Hyogo (JP); Yoshifumi Fukatsu, Hyogo (JP); Yasuo Nishioka, Hyogo (JP)

(73) Assignee: Fujitsu Ten Limited, Kobe (JP)

( * ) Notice: Subject to any disclaimer, the term of this patent is extended or adjusted under 35 U.S.C. 154(b) by 0 days.

(21) Appl. No.: 10/968,066

(22) Filed: Oct. 20, 2004

(65) Prior Publication Data

US 2005/0130463 A1 Jun. 16, 2005

(30) Foreign Application Priority Data

Oct. 21, 2003 (JP) ............................ P2003-361305

(51) Int. Cl.
*H01R 12/00* (2006.01)

(52) U.S. Cl. ........................... 439/82; 439/84; 439/885

(58) Field of Classification Search ................. 439/82, 439/84, 885
See application file for complete search history.

(56) References Cited

U.S. PATENT DOCUMENTS

| 4,995,816 | A | * | 2/1991 | Grabbe ........................ 439/71 |
| 5,452,512 | A | * | 9/1995 | Foley et al. ................... 29/874 |
| 5,564,954 | A | * | 10/1996 | Wurster ....................... 439/751 |
| 5,848,920 | A | * | 12/1998 | Klein et al. .................. 439/885 |
| 5,915,999 | A | * | 6/1999 | Takenaka et al. ........... 439/751 |
| 6,592,407 | B1 | * | 7/2003 | Korunsky et al. .......... 439/637 |
| 6,974,337 | B1 | * | 12/2005 | Belopolsky et al. .......... 439/82 |
| 6,997,756 | B1 | * | 2/2006 | Nakamura ................... 439/751 |
| 2004/0145880 | A1 | | 7/2004 | Watanabe et al. |

FOREIGN PATENT DOCUMENTS

| CN | 1194447 A | 9/1998 |
| JP | 2-119514 | 9/1990 |
| JP | 5-218669 | 8/1993 |
| JP | 6-60067 | 8/1994 |
| JP | 2911043 | 4/1999 |

* cited by examiner

*Primary Examiner*—Truc Nguyen
(74) *Attorney, Agent, or Firm*—Oliff & Berridge, PLC

(57) ABSTRACT

A pressfit terminal is to be inserted into a through hole defined in a substrate for electrically contacting with the through hole. The pressfit terminal includes a terminal main body and at least three protrusion portions. The at least three protrusion portions protrude outwardly from a surface of the terminal main body. At least part of the protrusion portions are arranged at intervals in a direction intersecting with an insertion direction of the terminal main body.

4 Claims, 6 Drawing Sheets

PRESSFIT TERMINAL AND CONNECTION STRUCTURE

BACKGROUND OF THE INVENTION

1. Filed of the Invention

The present invention relates to a pressfit terminal that can connect a connection terminal such as a connector to a printed wiring board without soldering and to a connection structure.

2. Description of the Related Art

In any of the conventional substrates such as a printed wiring board fitted with an electronic circuit loaded with electronic parts, connection terminals are used for electrical connection with any external source. There are many cases in which a plurality of connection terminals are assembled so as to form a connector. There are also many cases in which, not only electrical connection, but substantial mechanical strength is also required. For this reason, there are many instances in which connection terminals are used via insertion into through holes formed in a substrate instead of being loaded in the substrate surface.

In order to obtain stable electrical connection and mechanical strength, a connection terminal inserted into a through hole is often soldered. Mostly, the soldering process is practiced using eutectic crystal consisting of about 40% lead (Pb) and about 60% tin (Sn). However, as a result of recent tendencies to avoid the use of lead, specifically, due to the lead-free inclination, when connection terminals are soldered, it is required to use a lead-free brazing material. Nevertheless, generally, the lead-free brazing material requires temperature higher than that in a case of soldering with a eutectic crystal for connecting terminals. When the temperature is raised due to the soldering of the connection terminals, electronic parts forming an electronic circuit on a printed wiring board may incur an adverse influence. To solve this problem, attention has been focused on a pressfit terminal enabling highly reliable electrical connection without soldering (see JP-U-Hei.2-119514 and JP-B-2911043).

In a case where a substrate is thick due to multilayer structure, if only a single press contact portion between a pressfit terminal and an inner wall face portion of a through hole is provided in the thickness direction of the substrate, there is a fear that the substrate may bend due to the bending moment. To prevent this phenomenon, JP-U-Hei.2-119514 discloses a structure including plural press contact portions in the thickness direction of the substrate. JP-B-2911043 discloses a structure in which a body portion near a tip end of a pressfit terminal is divided into two parts and the two parts are deviated and can be contact with an inner wall face portion of a through hole.

SUMMARY OF THE INVENTION

A pressfit connector including a pressfit terminal has been adopted in an in-vehicle control computer. Various kinds of electronic control operations are also executed in vehicles driven by internal combustion engines. Control computers are used in many cases. Further, the hybrid system has already been put into practical service. A vehicle loaded with a hybrid engine is driven with an internal combustion engine operated under a highly efficient condition. Concurrently, electric power is also generated during running. While storing excessive electric power in a battery, drive force is secured by operating the internal combustion engine in combination with an electric power generating motor. Therefore, it becomes necessary to control large electric power. Further, in order to practically realize a system for obtaining drive force via an electric motor upon generation of electric power from a fuel battery, it is also necessary to control large electric power. Even if it is necessary to control large electric power, it is also required for a connector available for connection with an external source so as to be free from the use of lead and lower the cost of the product. Accordingly, there is a demand for realizing practical use of the pressfit connector.

However, the conventionally available pressfit terminals such as ones disclosed in JP-U-Hei.2-119514 and JP-B-2911043 were developed for use in a small signal system.

According to the structures disclosed in JP-U-Hei.2-119514 and JP-B-2911043, the contact resistance between the pressfit terminal and the inner wall surface of the through hole can be lowered. However, it is not possible to increase the current capacity of the pressfit terminal itself. In JP-U-Hei.2-119514, the plural press contact portions are formed in an insertions direction of the pressfit terminal. Therefore, it is necessary to increase the thickness of the substrate. In, when the through hole does not have a perfect circle shape, it is considered likely that an effect of the decreased contact resistance cannot fully be generated. The needs for controlling large electric power will grow further henceforth not only for the application of pressfit terminals to in-vehicle control computers, but also for application to various electrical appliances for promoting power and energy savings.

The invention provides a pressfit terminal and a connection structure that can increase current capacity and decrease contact resistance between the pressfit terminal a through hole.

According to one embodiment of the invention, a pressfit terminal is to be inserted into a through hole defined in a substrate for electrically contacting with the through hole. The pressfit terminal includes a terminal main body and at least three protrusion portions. The protrusion portions protrude outwardly from a surface of the terminal main body. At least part of the protrusion portions are arranged at intervals in a direction intersecting with an insertion direction of the terminal main body.

With this configuration, connection points between the pressfit terminal and the inner wall face portion of the through hole are increased. As a result, the contact resistance therebetween can be reduced. Since the contact resistance therebetween can be reduced, it becomes possible to enlarge a section area of the terminal main body, to increase the current capacity, and to flow large current.

According to one embodiment of the invention, a pressfit terminal is to be inserted into a through hole defined in a substrate for electrically contacting with the through hole. The pressfit terminal includes a terminal main body and a plurality of protrusion portions. The terminal main body is insertable into the through hole and has a substantially plate shape. The plurality of protrusion portions protrude outwardly from thickness-direction surfaces of the terminal main body. At least two of the protrusion portions are arranged in a width direction of the terminal main body on one of the surfaces of the terminal main body at intervals.

With this configuration, since the terminal main body has the substantially plate shape, the current capacity can be increased by enlarging the width of the terminal main body. Also, the at least two of the protrusion portions are arranged in the width direction of the terminal main body on one of the surfaces of the terminal main body at intervals. Therefore, the contact resistance between the pressfit terminal and the through hole can be reduced.

According to one embodiment of the invention, at least one of the protrusion portions may protrude from the other surface that is opposite to the one of the surfaces of the terminal main body. Also, the at least one of the protrusion portions on the other surface may be provided at a position opposite to, via the terminal main body, a space defined between the protrusion portions on the one of the surfaces.

With this configuration, stable contact state can be kept in the through hole.

Further, according to one embodiment of the invention, the pressfit terminal may further include protrusion portions that protrude from width-direction surfaces of the terminal main body.

With this configuration, the contact points between the inner wall face portions of the through hole and the pressfit terminal can be increased.

According to one embodiment of the invention, a pressfit terminal is to be inserted into a through hole defined in a substrate for electrically contacting with the through hole. The pressfit terminal includes a conductive terminal main body and a plurality of branch portions. The branch portions branch from a tip end of the terminal main body. Each of the branch portions has a pressfit shape.

With this configuration, the current capacity between the plural branch portions and the through hole can be increased to several times.

According to one embodiment of the invention, a connection structure electrically connects a substrate with a pressfit terminal. The connection structure includes the substrate and the pressfit terminal. The substrate defines a plurality of through holes electrically connecting with each other via a common land. The pressfit terminal includes a conductive terminal main body and a plurality of branch portions. The branch portions branch from a tip end of the terminal main body. Each of the branch portions has a pressfit shape. Each of the branch portions press contacts with an inner wall face of each of the through hole in a state where each of the branch portions is inserted into each of the through holes.

With this configuration, it becomes possible to flow large current.

DETAILED DESCRIPTION OF THE PREFERRED EMBODIMENT

FIG. 1 shows a schematic form and the use condition of a pressfit terminal 11 according to an embodiment of the present invention. FIG. 1A and FIG. 1B are a front view and a side view showing the tip end portion thereof, respectively. FIG. 1C shows the use condition of the pressfit terminal 11 in a section view taken along the longitudinal direction. FIG. 1D is a perspective view showing the structure of the tip end portion of the pressfit terminal 11.

Figure 1A:
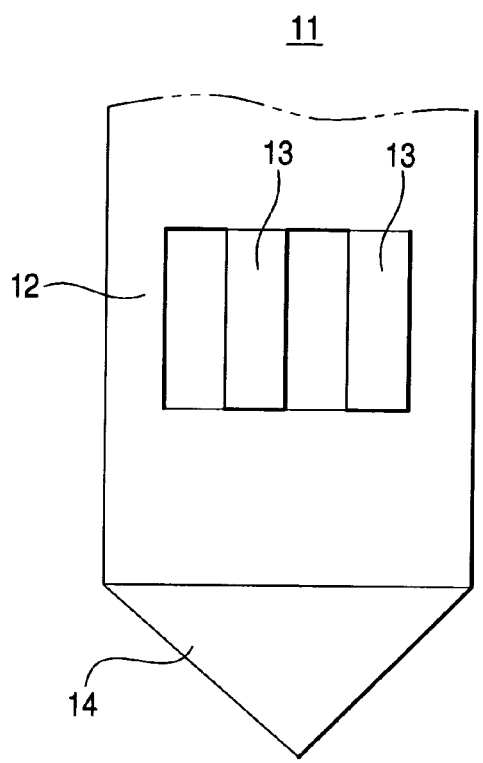
FIG. 1A and FIG. 1B are a front view and a side view showing a tip end portion of a pressfit terminal according to an embodiment of the invention, respectively.
Figure 1B:
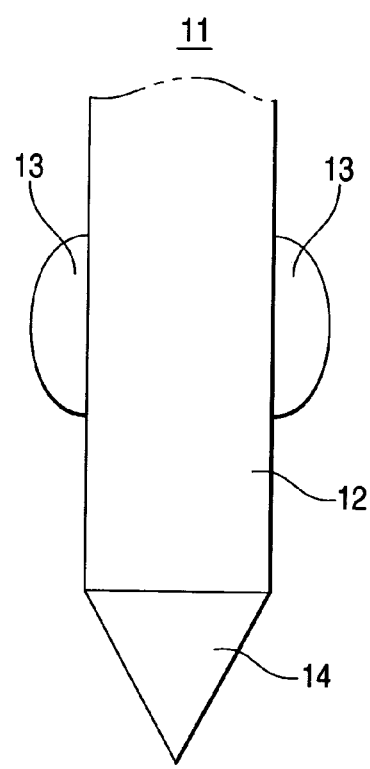

As shown in FIG. 1A schematically, the pressfit terminal 11 includes a main body 12 of a plate-like shape. The pressfit terminal 11 is made of a copper alloy having high elasticity and high conductivity. As shown in FIG. 1B, a plurality of protrusion portion 13 protrude outwardly from surfaces of the terminal main body 12. Each of the protrusion portions 13 has a substantially semicircular cylindrical shape when viewed from the width direction of the pressfit terminal 11. Width of the terminal main body 12 shown in FIG. 1A may be greater than thickness thereof shown in FIG. 1B. In that case, in comparison with JP-U-Hei.2-119514 and JP-B-2911043, the protrusion portions 13 of the pressfit terminal 11 have larger section area. Therefore, a contact portion between the pressfit terminal 11 and an inner wall face portion 22 has larger current capacity. The tip of the main body 12 is formed as a tapered tip end portion 14.

Figure 1C:
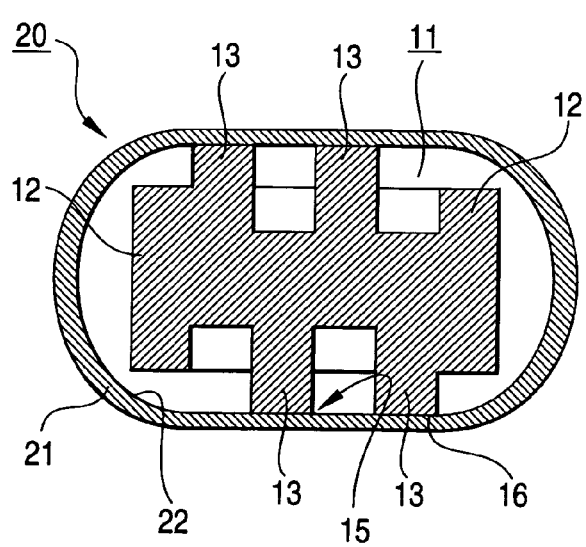
FIG. 1C shows the use condition of the pressfit terminal 11 in a section view.
Figure 1D:
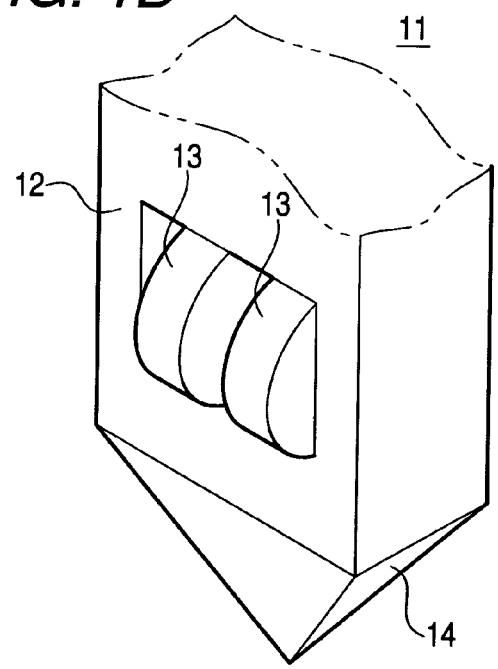
FIG. 1D is a perspective view showing the structure of the tip end portion of the pressfit terminal 11.
Figure 2A:
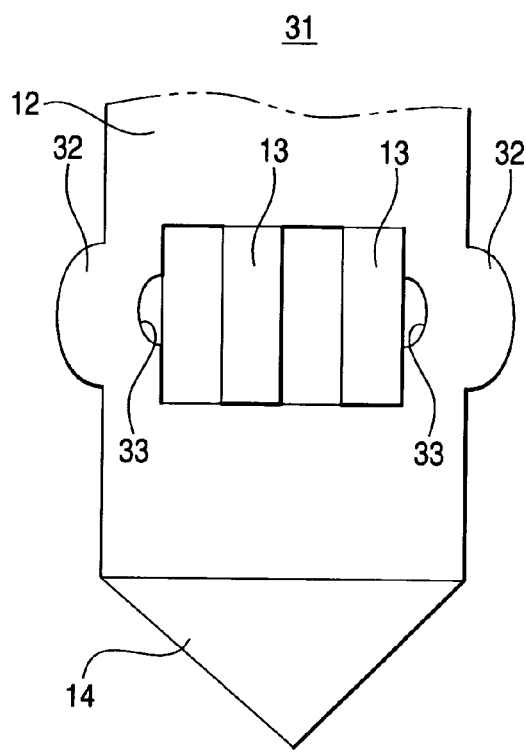
FIGS. 2A and 2B are a front view and a side view showing a pressfit terminal 31 according to another embodiment of the invention.
Figure 2B:
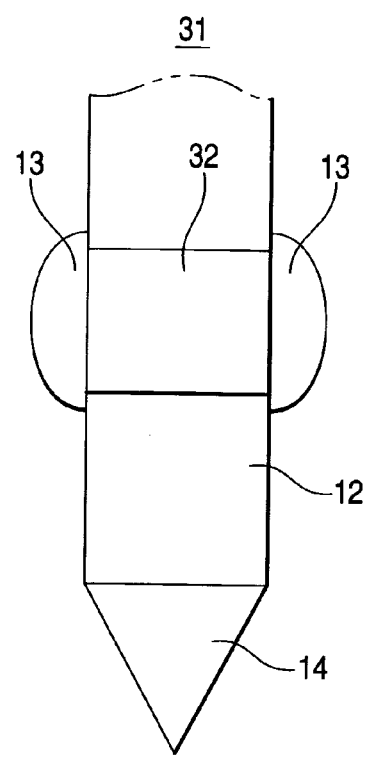
Figure 2C:
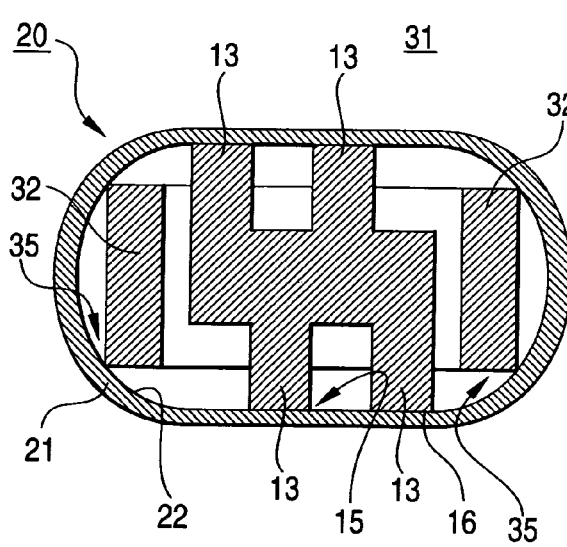
FIG. 2C shows the use condition of the pressfit terminal 31 in section.
Figure 2D:
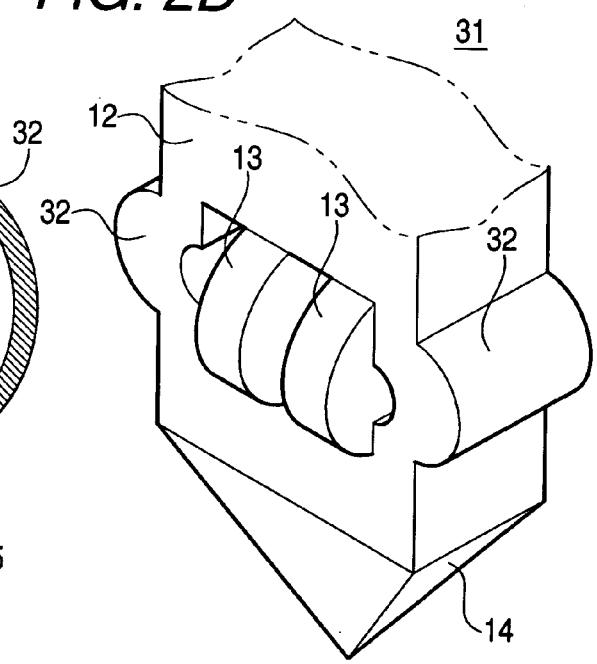
FIG. 2D is a perspective view showing a tip end portion of the pressfit terminal 31.

As shown in FIG. 1C, a plurality of protrusion portions 13 are arranged at an interval in the width direction of the terminal body portion on one of the surfaces thereof. The protrusion portions 13 on the other surface are formed at least at portions corresponding to the intervals on the one of the surfaces. As shown in the figure, concave portions may be formed between the protrusion portions 13. When the pressfit terminal 11 having the abovementioned shape in section is inserted into a through hole 20 having an oval shape in section, corner portions 15 and outer surface portions 16 of the protrusion portions 13 electrically contact with the inner wall face portion 22 of the through hole 20. The terminal main body 12 has a rectangular shape in section and can be inserted into the through holes 20 with spatial allowance. The through hole 20 is made of conductive material such as copper. The through hole 20 includes a land portion 21 surrounding an opening defined in a surface of the substrate and the inner wall face portion 22 covering the inner circumferential surface of the through hole 20 of the substrate. Generally, after the land portion 21 is formed on the surface of an insulation substrate via an etching process or an additive process, the inner wall face portion 22 is formed on the inner circumferential surface of the through hole 20 via an electrodeposition technique. The thickness of the inner wall face portion 22 is approximately several tens μm. The protrusion portions 13 alternately protruding from the surfaces of the terminal main body 12 are press-contacted with the inner wall face portion 22 of the through hole 20 to make electrical connection therebetween.

If the through hole 20 has an oval shape in section, flat portions of the inner wall face portion 22 face each other, so that the flat external surface portions 16 of the protrusion portions 13 face-contact with the flat portions of the inner wall face portion 22.

Due to the face-contact, the pressfit terminal 11 has the contact area several ten times as large as the conventional art. The increase of the contact area suppresses thermal generation at the contact portion due to flowing of the conduction of large electric power.

FIG. 1C shows a structure in the vicinity of the most protrusive portion of the protrusion portion 13 in section. The contact between the protrusion portions 13 and the inner wall face portion 22 is stable so long as at least two of the protrusion portions 13 protrude from one of the surfaces of the terminal main body 12 and at least one of the protrusion portions 13 protrudes from the other surface of the terminal main body 12 at an intermediate position between the two. If only a single protrusion portion 13 protrudes from each surface of the terminal main body 12, there is a fear that the width direction of the terminal main body 12 may be inclined with respect to the extending direction of the oval shape of the through hole 20. Even if the through hole 20 does not have the oval shape but has an elliptic shape in section, at least the corner portions 15 keep being in contact with the inner wall face portion 22 due to elastic deformation of the protrusion portions 13. Therefore, the contact resistance therebetween can be reduced.

FIG. 2 shows a schematic shape and the use condition of a pressfit terminal 31 according to another embodiment of the invention. FIGS. 2A and 2B are a front view and a side view showing the pressfit terminal 31. FIG. 2C shows the use condition of the pressfit terminal 31 in section, taken along a direction perpendicular to the longitudinal direction. FIG. 2D is a perspective view of the structure of the tip end portion of the pressfit terminal 31. In this embodiment, components corresponding to those of the preceding embodiment shown in FIG. 1 are respectively designated by identical reference numerals, and duplicate description thereof will be omitted.

In the pressfit terminal 31 according to the this embodiment, protrusion portions 32 protruding in the lateral direction are added to the tip end portion of the terminal main body 12 of the pressfit terminal 11 shown in FIG. 1. The pressfit terminal 31 is formed in a square bar shape to have a diagonal diameter smaller than the inner diameter of the through hole 20 and may be made of a metallic material having high elasticity and high conductivity, such as phosphor bronze. The pressfit terminal 31 is formed by punching a belt-like metallic material so that the metallic material will have a width approximately same the plate thickness due to the pressing pressure. Diameter expansion holes 33 are bored in the pressfit terminal 31 by a progressive die to widen the both sides of the pressfit terminal 31 in the width direction, thereby forming the protrusion portions 32. When the pressfit terminal 31 is in the use condition, the protrusion portions 32 protruding in the width direction are also in elastically contact with the inner wall face portion 22 of the through hole 20 so as to form the contact portions and contribute to the electrical connection. As a result, the contact resistance is reduced.

Since the inner wall face portion 22 is formed in the concave curve surface, only corner portions 35 among the protrusion portions 32 are in contact with the inner wall face portion 22 of the through hole 20. If the corner portions 35 are chamfered to have a curved shape, concave curve surfaces of the protrusion portions 32 are in contact with the concave curve surface of the inner wall face portion 22, thereby increasing the contact area. As a result, the contact resistance therebetween can be reduced. Further, it is assumed that the through hole 20 has an elliptic or other shape in section and the inner wall face portion 22 with which the protrusion portions 13 and the protrusion portions 32 are in contact has a convex curve surface. Even in such a case, when outer surfaces of the protrusion portions 13 and the protrusion surface 32 are formed in convex curve surfaces, which fit the concave curve surface thereof, the contact area is increased. As a result, the contact resistance can be reduced.

Also, in the pressfit terminal 11 shown in FIG. 1, the both sides thereof in the width direction are not in contact with the curved surface portion of the inner wall face portion 22 of the through hole 20. Therefore, in the case of forming a connector, depending on the fixed condition of the connector, a so-called pinch force is generated in the width direction. Thus, there is a fear that the protrusion portions 13 may slightly slide against the inner wall face portion 22. Once the minute sliding has occurred, the contact portion incurs oxidation and degradation. This leads to increase of the contact resistance. However, since the pressfit terminal 31 includes the protrusion portions 32 in the width direction as well as the protrusion portions 13, the minute sliding can be prevented.

Figure 3:
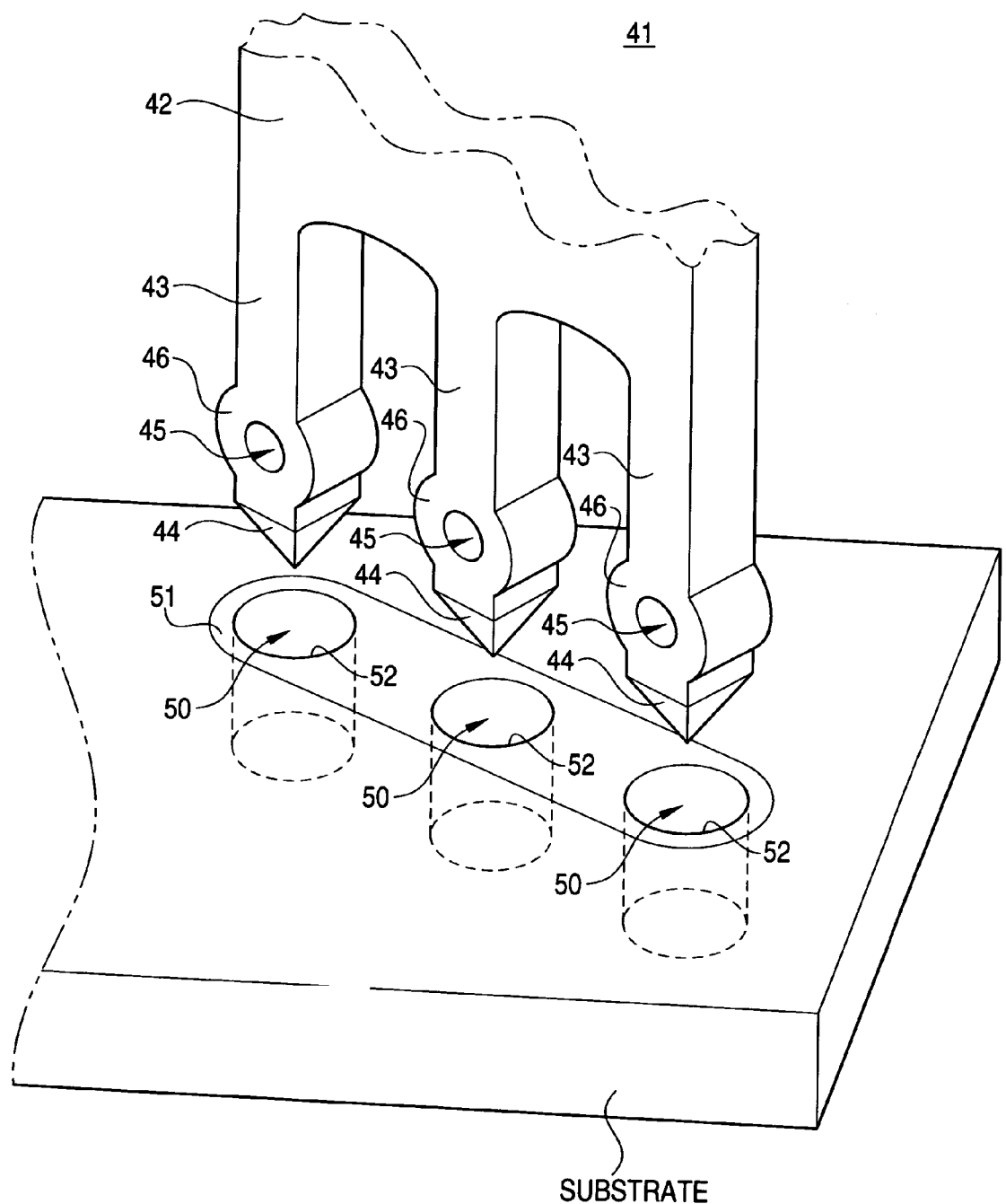
FIG. 3 shows schematic appearance of a pressfit terminal 41 according to still another embodiment of the invention.
Figure 7A:
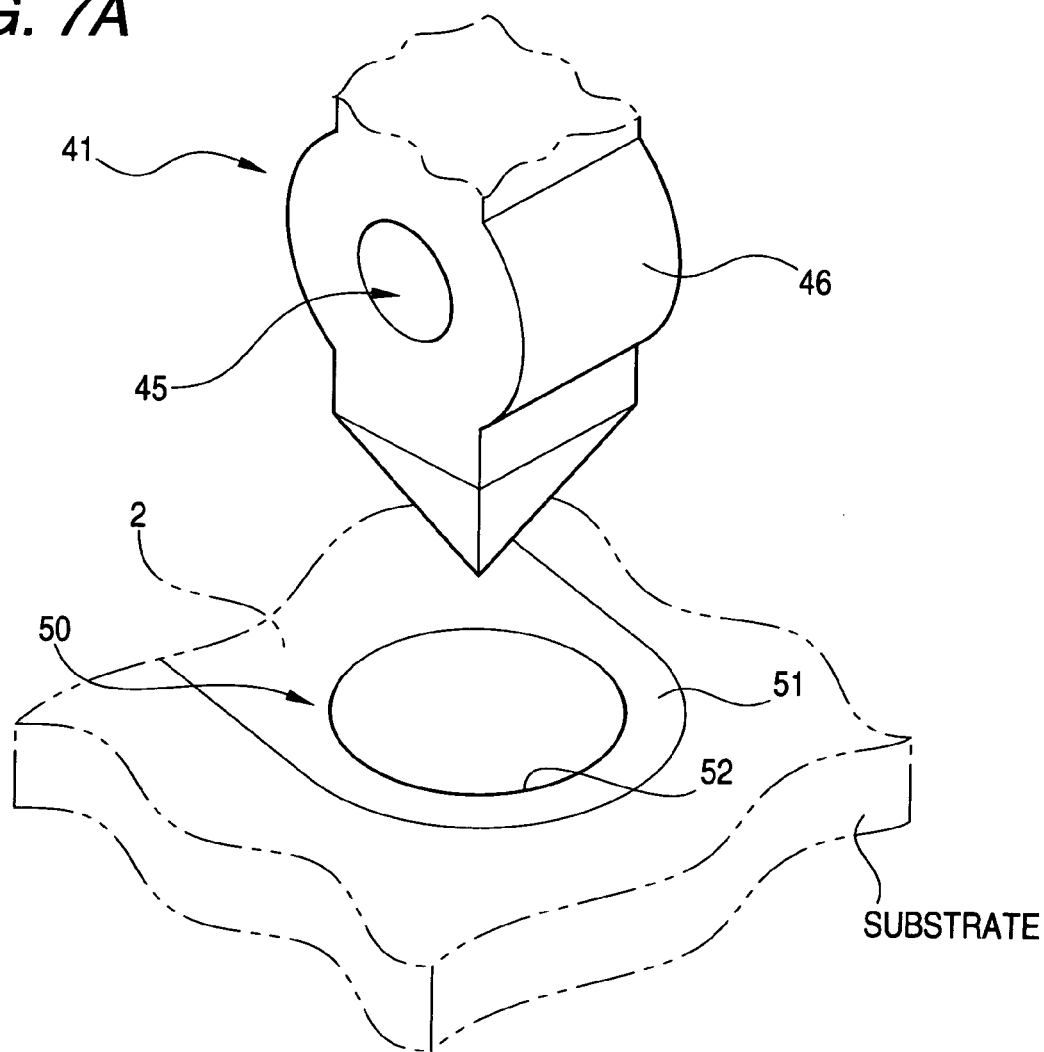
FIG. 7A is an enlarged view showing a state immediately before one of branch portions 43 is inserted into one of through holes 50.
Figure 7B:
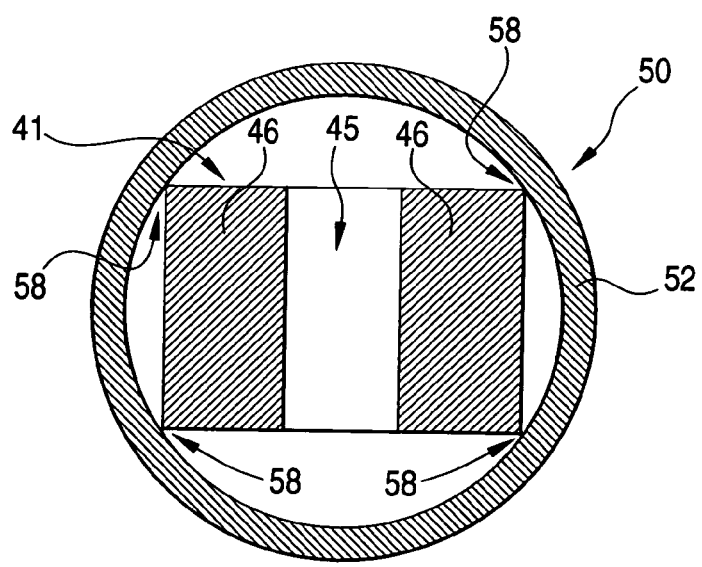
FIG. 7B is a section view showing a state where the branch portion 43 is inserted into the through hole 50.

FIG. 3 shows schematic appearance of a pressfit terminal 41 according to still another embodiment of the invention. The pressfit terminal 41 of this embodiment is formed so that the tip end side of a wide-width terminal main body 42 is divided into plural branch portions 43. Each of the branch portions 43 may be configured as shown in FIG. 7, for example. FIG. 7A is an enlarged view showing a state immediately before one of the branch portions 43 is inserted into one of through holes 50. FIG. 7B is a section view showing a state where the branch portion 43 is inserted into the through hole 50. Each of the branched units 43 having a rectangular shape in section includes a tapered tip end portion 44 and protrusion portions 46 protruding in the width direction due to the formation of a diameter expansion hole 45. The protrusion portion 46 has an outer diameter larger than an inner diameter of the through hole, in the width direction. The through holes 50 are defined in a common land portion 51 at intervals corresponding to the branch portions 43. Each through hole 50 has an inner wall face portion 52 surrounding its inner peripheral surface.

When the pressfit terminal 41 is inserted into the through holes 50, the protrusion portions 46 of each branch portion 43 becomes in elastically press-contact with the inner wall face portion 52. Thus, the electrical connection can be made between the protrusion portions 46 and the inner wall face portion 52. If the through hole 50 has a perfect circle shape and the protrusion portions 46 are formed uniformly on the both sides of the branch portion 43 in the width direction, four corner portions 58 form the contact portion. Since the pressfit terminal 41 includes the plural branch portions 43, the plural electric contact portions exist between the pressfit terminal 41 and the inner wall face portions 50. As a result, the contact resistance can be reduced in total.

Further, even if each branch portion 43 includes a single protrusion portion 46, the electrical connection can be made at may contact portions so long as the single pressfit terminal 42 includes at least three branch portions 43. Therefore, the contact resistance can be reduced.

Furthermore, the wide-width terminal main body 42 from which the branched potions 43 branch can obtain a heat radiation effect. When large current flows through the contact portion between the protrusion portion 46 and the inner wall face portion 52, heat is generated due to the contact resistance. Thus, temperature is increased, so that the contact resistance is also increased. However, the pressfit terminal 41 can suppress the increase of temperature utilizing the heat radiation at the terminal main body 42. Therefore, the increase of the contact resistance due to the increase of the temperature can also be reduced.

The through holes 50 can be defined by merely punching plural through holes in the substrate. With regard to the through hole 20 having the oval shape in section as shown in FIGS. 1 and 2 and a through hole having the elliptic shape in section, it is necessary to perform a finishing process so that the inner peripheral surface thereof becomes smooth after plural through holes are defined in the substrate to be adjacent each other.

Figure 4:
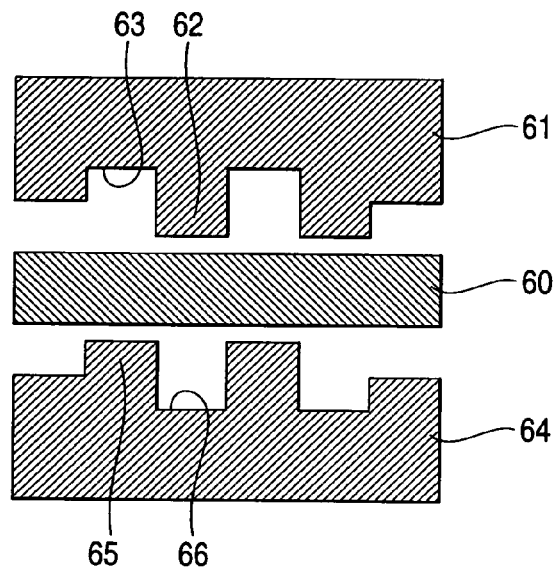
FIG. 4 is a schematic view showing a press mold for forming the protrusion portion 13 of the pressfit terminals 11 and 31 shown in FIGS. 1 and 2.

FIG. 4 is a schematic view showing a press mold for forming the protrusion portion 13 of the pressfit terminals 11 and 31 shown in FIGS. 1 and 2. The pressfit terminals 11 and 31 may be formed from a material 60 such as copper alloy by punching the material 60 with a progress die. The pressing process is divided into plural steps and is executed continuously so that processing steps can be sequentially executed per stroke of a pressing machine. In one of these sequential steps, the material 60 is sandwiched between a convex portion 62 and a concave portion 63 formed in an upper mold 61 and another convex portion 65 and another concave portion 66 formed in a lower mold 64, thus forming the convex portions 13 protruding in the thickness direction of the material 60. In order to alternately form the protrusion portions 13, the convex portion 62 of the upper mold 61 should be disposed to face the concave portion 66 of the lower mold 64, and further the concave portion 63 of the upper mold 61 should be disposed to face the convex portion 65 of the lower mold 64.

The pressfit terminals 11, 31, and 41 of each embodiment may be formed not only by the pressing process, but also by a cutting process, a discharge process, an electrolyzing process, a laser applying process, and an etching process, for example. After the pressfit terminals 11, 31, and 41 are formed into basic configurations, a surface treatment, e.g. metal plating with nickel, gold, rhodium, or tin, is applied thereto.

Figure 5:
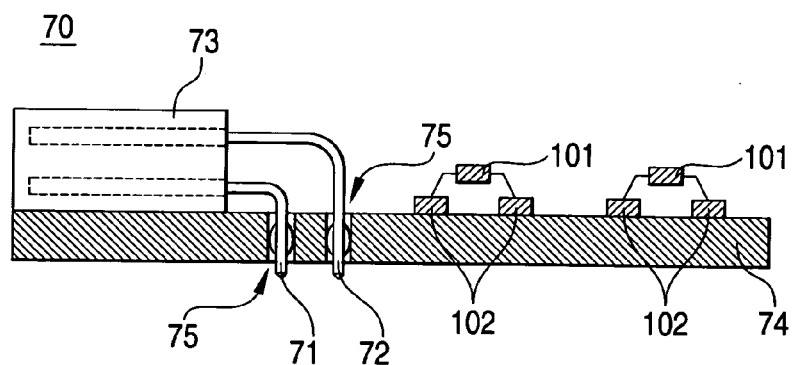
FIG. 5 is a schematic view showing a connector 70 for external connection that includes plurality press fit terminals 11, 31, and 41 shown in FIGS. 1–3.

FIG. 5 is a schematic view showing a connector 70 for external connection that includes plurality pressfit terminals 11, 31, and 41 according to the above-described embodiments. On one end side of the connector 70 for external connection, a terminal having the same shape as any one of the pressfit terminals 11, 31, and 41 is formed. On the other side thereof, connector terminals 71, 72 and a housing 73 are provided. The connector terminals 71, 72 are plural connection terminal having a predetermined terminal shape for connection. The housing 73 holds and fixes the plural connector terminals 71, 72. The housing 73 is held and fixed to the substrate in an insulation manner so that the connector terminals 71, 72 are inserted into and connected with through holes 75 defined in the substrate 74 on the one side thereof and that a predetermined connector is detachably connected to the other side thereof. The connection between the substrate 74 and the connector terminals 71, 72 can be completed by just inserting the connector terminals 71, 72 into the through holes 75, and high reliability can be obtained. Therefore, it is possible to attach the connector 70 on the substrate 74 with high productivity without being affected by heating unlike the case of bonding them via a soldering process. Since each connector terminal 71, 72 can resist large electric power, the connector 70 can be used in large electric power control.

Figure 6:
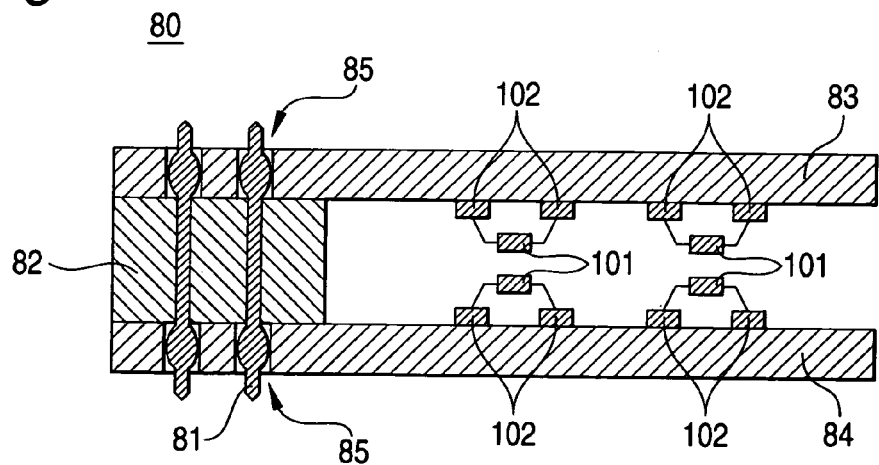
FIG. 6 is a schematic view showing a relay connector 80 using a pressfit terminal having the same shape as the pressfit terminals 11, 31, and 41 shown in FIGS. 1–3.

FIG. 6 is a schematic view showing a relay connector 80 using a pressfit terminal having the same shape as the pressfit terminals 11, 31, and 41 according to the above-referred embodiments. The relay connector 80 includes plural relay terminals 81 and an insulator 82. The relay terminals 81 include at both ends the same shape as any one of the pressfit terminals 11, 31, and 41. The insulator 82 holds the connection terminals 81 to separate them from each other. The insulator 82 holds the both substrates 83, 84 and the relay terminals 81 in an insulating state so that the relay terminals 81 can electrically connect between the substrates 83, 84 facing each other. The electrical connection between the substrates 83, 84 can be completed by just inserting the both ends of each relay terminal 81 into through hole 85 defined in the substrates 83, 84.

Figure 8:
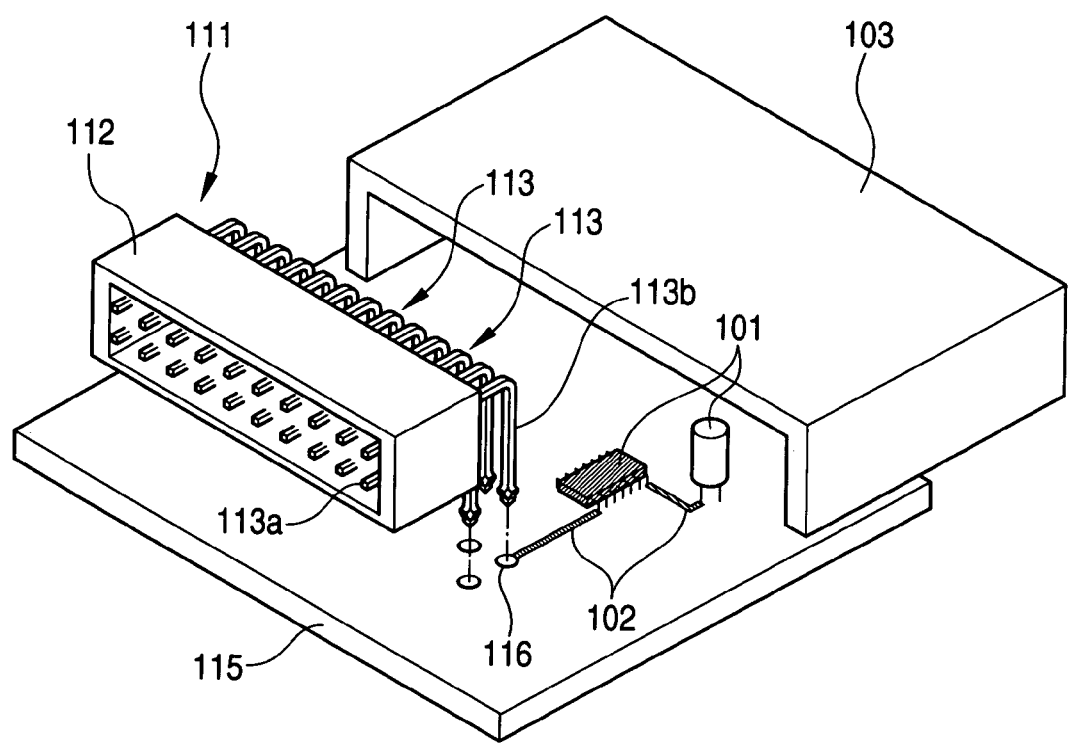
FIG. 8 is a schematic view showing an electronic device 111 according to one embodiment of the invention.

FIG. 8 is a schematic view showing an electronic device 111. The electronic device 111 includes a circuit board 115 that defines plural through holes 116, and a connector. Electronic parts 101 are mounted on the substrate 115 and are connected each other via wiring 102. The connector includes a housing 112, terminals 113a, and pressfit terminals 113 that is inserted into the through holes 116. Since the terminals 113a protrudes in the housing 112, another female connector can be connected to the housing 112. An end portion 113b of each pressfit terminal 113 has a similar shape to any one of those of the pressfit terminals 11, 31, 41 as set forth above.

What is claimed is:

1. A pressfit terminal to be inserted into through holes defined in a substrate, the through holes electrically connecting with each other via a common land formed on a surface of the substrate, the pressfit terminal for electrically contacting with the through holes, the pressfit terminal comprising:
    a conductive terminal main body; and
    a plurality of branch portions that branch from a tip end of the terminal main body to extend in a longitudinal direction of the terminal main body;
    wherein each of the branch portions has a pressfit shape.

2. The pressfit terminal according to claim 1, wherein each of the branch portions press contacts with an inner wall face of the through hole in a state where each of the branch portions is inserted into the through hole.

3. A connection structure comprising:
    a substrate that defines a plurality of through holes electrically connecting with each other via a common land;
    a pressfit terminal including:
        a conductive terminal main body; and
        a plurality of branch portions that branch from a tip end of the terminal main body, wherein:
    each of the branch portions has a pressfit shape; and
    each of the branch portions press contacts with an inner wall face of each of the through hole in a state where each of the branch portions is inserted into each of the through holes.

4. An electronic device comprising:
    a substrate that defines a plurality of through holes electrically connecting with each other via a common land; and
    a pressfit terminal including:
        a conductive terminal main body; and
        a plurality of branch portions that branch from a tip end of the terminal main body, wherein:
    each of the branch portions has a pressfit shape; and
    each of the branch portions press contacts with an inner wall face of each of the through hole in a state where each of the branch portions is inserted into each of the through holes.

* * * * *